(12) United States Patent
Fagerhoj

(10) Patent No.: US 6,925,575 B2
(45) Date of Patent: Aug. 2, 2005

(54) SELECTABLE CLOCKING SYNCHRONIZATION OF A PARALLEL-TO-SERIAL CONVERTER AND MEMORY

(75) Inventor: Thomas O. Fagerhoj, Ringsted (DK)

(73) Assignee: Intel Corporation, Santa Clara, CA (US)

(*) Notice: Subject to any disclaimer, the term of this patent is extended or adjusted under 35 U.S.C. 154(b) by 613 days.

(21) Appl. No.: 10/117,702

(22) Filed: Apr. 5, 2002

(65) Prior Publication Data

US 2003/0190003 A1 Oct. 9, 2003

(51) Int. Cl.[7] .............................. G06F 1/12; H04L 5/00
(52) U.S. Cl. .......................... 713/400; 710/71; 375/354
(58) Field of Search ................... 713/1–100, 300–601; 375/354; 710/71; 331/1–187

(56) References Cited

U.S. PATENT DOCUMENTS

| | | | | |
|---|---|---|---|---|
| 5,319,339 A | * | 6/1994 | Leupold | ...................... 335/306 |
| 5,319,369 A | | 6/1994 | Majos et al. | |
| 5,369,376 A | * | 11/1994 | Leblebicioglu | ................. 331/8 |
| 5,563,594 A | * | 10/1996 | Ford et al. | ................... 341/100 |
| 5,896,391 A | * | 4/1999 | Solheim et al. | ............. 714/704 |
| 6,188,286 B1 | * | 2/2001 | Hogl et al. | ..................... 331/2 |
| 6,252,465 B1 | * | 6/2001 | Katoh | .......................... 331/25 |
| 6,667,663 B2 | * | 12/2003 | Ozawa | ......................... 331/17 |
| 6,828,864 B2 | * | 12/2004 | Maxim et al. | ................ 331/17 |
| 6,845,074 B1 | * | 1/2005 | Fujita | ...................... 369/59.17 |

* cited by examiner

Primary Examiner—Lynne H. Browne
Assistant Examiner—Anand B. Patel
(74) Attorney, Agent, or Firm—Trop, Pruner & Hu, P.C.

(57) ABSTRACT

A technique includes providing a first clock signal to a parallel-to-serial data conversion circuit and providing a second clock signal to a memory storing data for conversion by the conversion circuit. One of the first and second clock signals is selectively synchronized to a reference clock signal.

21 Claims, 7 Drawing Sheets

SELECTABLE CLOCKING SYNCHRONIZATION OF A PARALLEL-TO-SERIAL CONVERTER AND MEMORY

BACKGROUND

The invention generally relates to a selectable clocking architecture.

Referring to FIG. 1, for purposes of generating an optical signal that is transmitted through an optical fiber 20, a serializer/transmitter 5 may be used. In this manner, the transmitter 5 receives bits of data in parallel from an output register 24 and converts this parallel stream of data into an output signal that indicates a serial stream of data. The output signal, in turn, is communicated to the optical fiber 20. To accomplish this, the transmitter 5 may include an input register 12 that receives in parallel bits of data (from the output register 24) to be communicated to the fiber 20. The data that is received by the input register 12 is communicated to a parallel-to-serial conversion circuit, or selector 14, that is coupled to the fiber 20 via an electrical-to-optical (E/O) converter 11. The selector 14, in turn, generates the output signal (at its output terminal) that indicates the bits of the serial stream of data. For an optical serial bus 20, the selector 14 may be coupled to the bus 20 via an optical source 11 that is driven by the output signal from the selector 14.

Operations of the input register 12 are synchronized to edges of a clock signal (called "TXPICLK signal") that appears on a clock signal line 19 of the transmitter 5. In this manner, in synchronization to predefined edges of the TXPICLK signal, the output register 24 receives new data and transfers stored data to the input register 12.

Because of the nature of the parallel-to-serial conversion that is performed by the selector 14, the selector 14 is clocked by a clock signal (that appears on a clock signal line 13) that has a higher frequency than the TXPICLK signal. To generate this line rate clock signal 13, clock multiplying unit circuitry (not shown) of the transmitter 5 must be implemented in the transmitter 5.

Ideally, the clock signal on the clock signal line 13 and the TXPICLK signal are synchronized, although these signals have different frequencies. However, the manner in which these clock signals are generated and the manner in which these clock signals are synchronized to each other may affect various properties that are associated with the transmitter 5. For example, the manner in which these clock signals are generated and synchronized to each other may affect the phase error, or jitter, between the clock signals, the phase margin, the power dissipated by the clock generating circuitry and the board space consumed by the clock generating circuitry.

DETAILED DESCRIPTION

Figure 1:
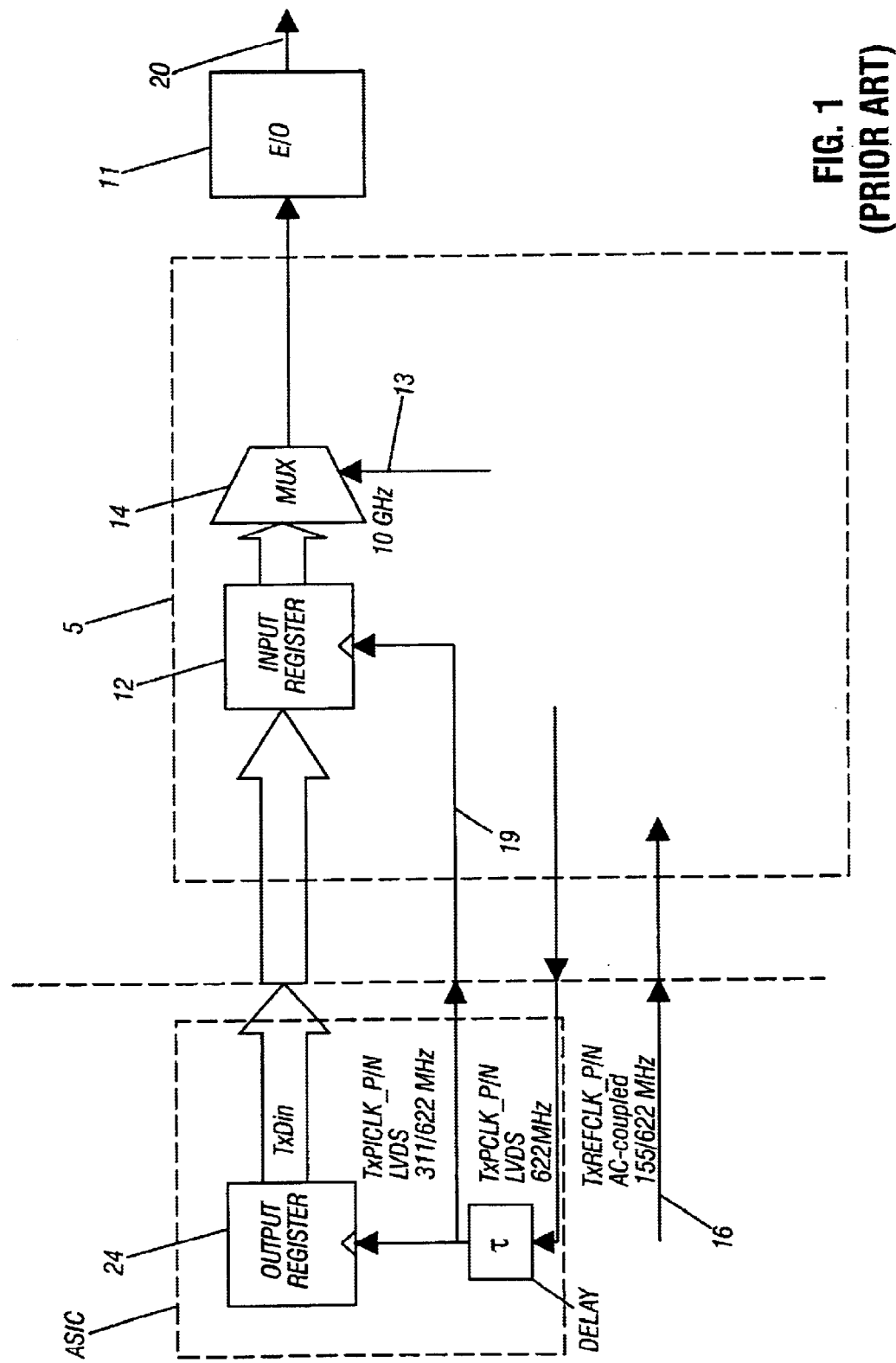
FIG. 1 is a schematic diagram of a serial bus transmitter of the prior art.
Figure 2:
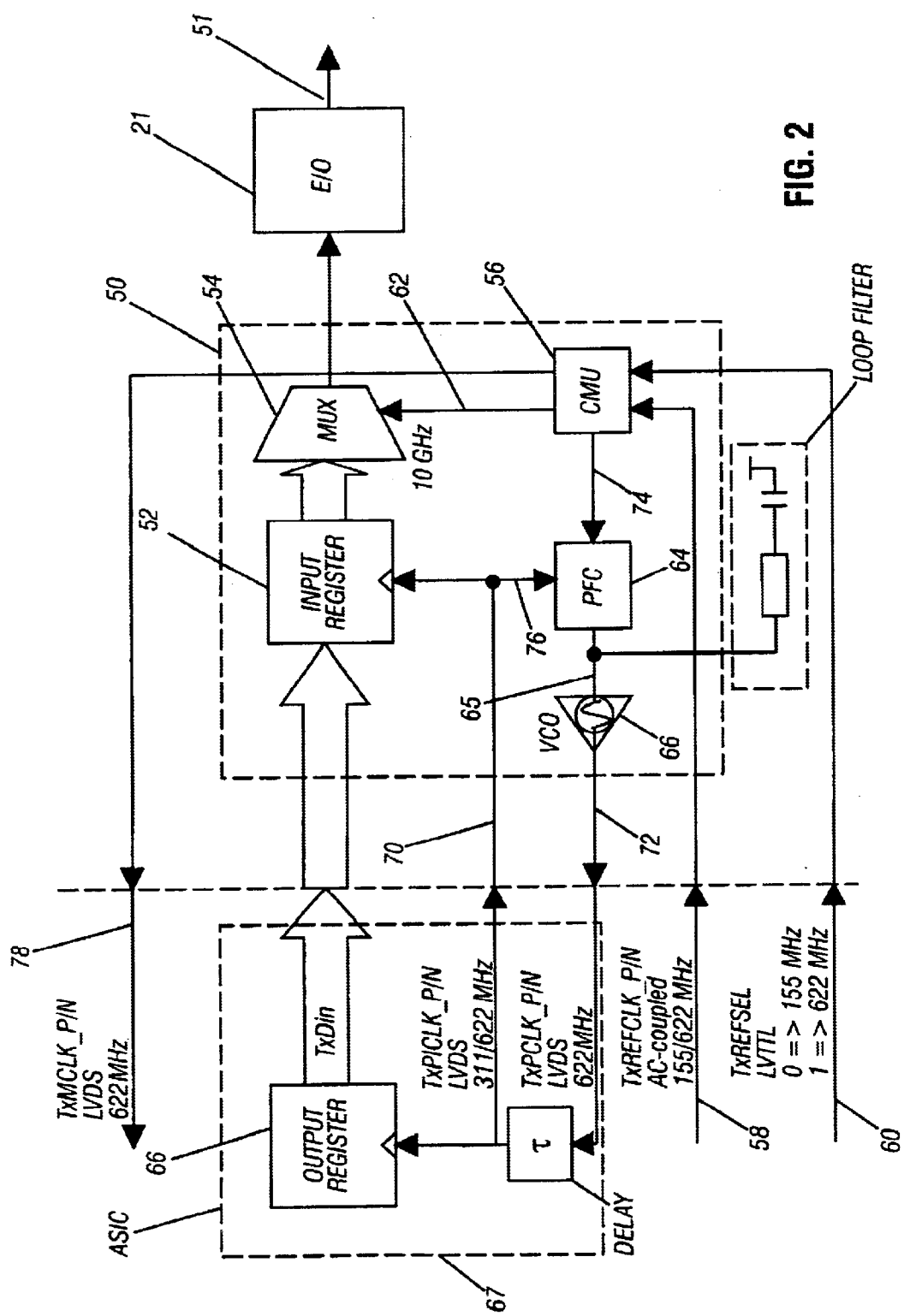
FIGS. 2 and 3 are schematic diagrams of serializers/transmitters.
Figure 3:
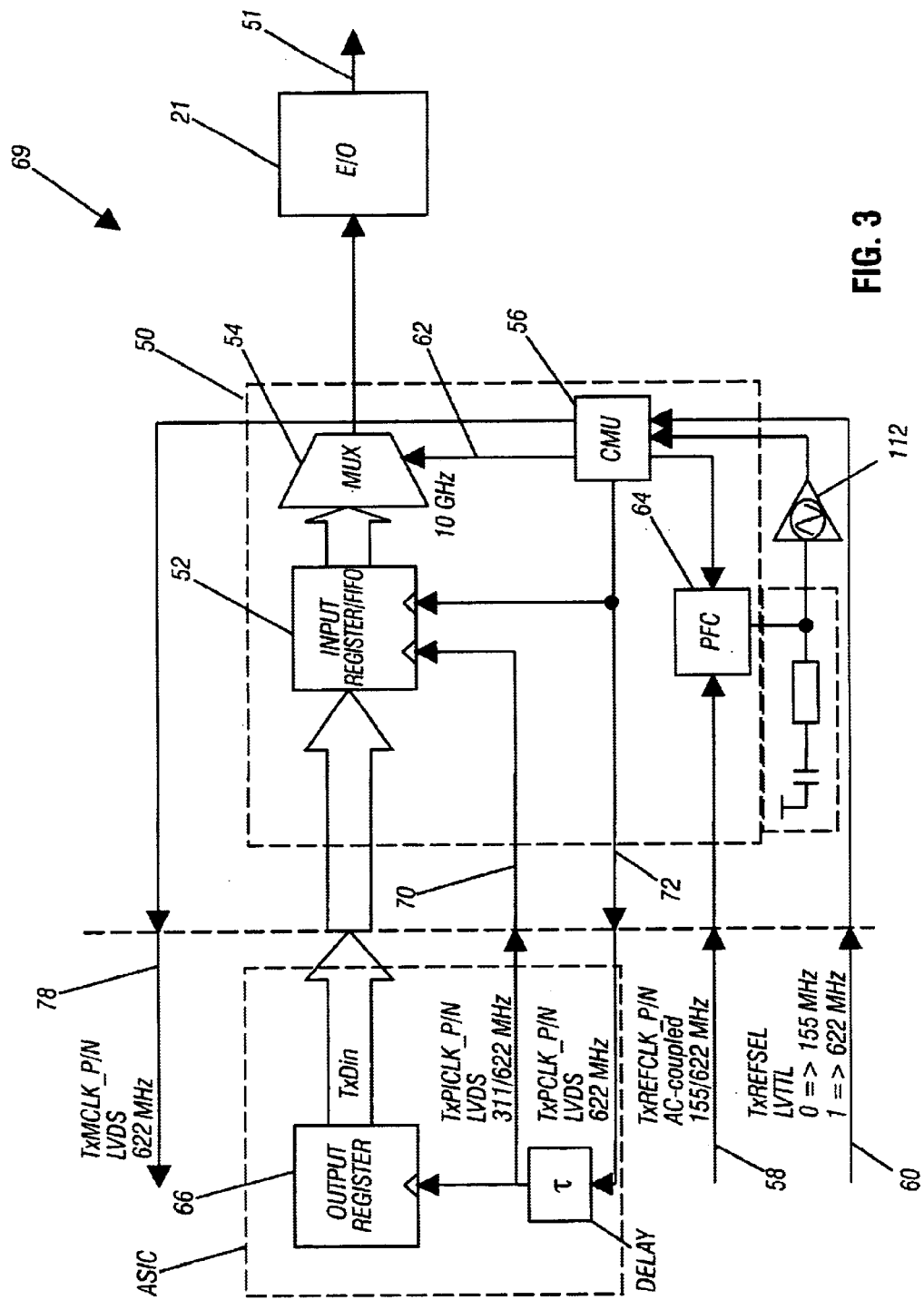

FIGS. 2 and 3 depict different schemes for generating clock signals that are associated with the communication of data through a transmitter or serializer to an optical fiber 51.

More particularly, referring to FIG. 2, one such scheme involves using a serializer, or transmitter 50. The transmitter 50 includes a parallel-to-serial conversion circuit, or multiplexer 54, that furnishes a signal that indicates serial bits of data. This signal drives an electrical-to-optical (E/O) converter 21 that, in response, drives an optical signal on the optical fiber 51.

The signal that is furnished by the multiplexer 54 indicates serial bits of data that are received in parallel by the multiplexer 54 from an input register 52 of the transmitter 50. In this manner, the input register 52 receives data from an output register 66 (of an application specific integrated circuit (ASIC) 67) and communicates data to the multiplexer 54 in synchronization with a clock signal (called "TXPICLK") that appears on a clock signal line 70. The output register 66 receives a signal called "TXPCLK" signal (same signal as the "TXPICLK" signal apart from a phase difference due to a round trip delay mainly caused by the ASIC 67) and synchronizes the furnishing of its data to the input register 52 in synchronization with edges of the TXPICLK signal.

The multiplexer 54 operates at a higher frequency than the input 52 and output 66 registers due to the parallel-to-serial conversion of data that is performed by the multiplexer 54. In this manner, the operation of the multiplexer 54 is synchronized to the edges of a clock signal that is received by the multiplexer 54 from a clock signal line 62.

For purposes of generating the clock signal present on the TXPCLK clock signal line 72, the transmitter 50 includes a phase frequency comparator (PFC) 64 and a voltage controlled oscillator (VCO) 66 that form, at least in part, a phase locked loop circuit. The transmitter 50 uses this phase locked loop circuit to ensure that the TXPICLK signal is in synchronization with the clock signal that appears on the clock signal line 62. As depicted in FIG. 2, the output terminal of the VCO 66 generates the TXPCLK signal on the clock signal line 72. Due to the arrangement depicted in FIG. 2, the clock signal line 72 is coupled to the clock signal line 70 on which the TXPICLK signal appears. Thus, as shown, the VCO 66 compensates for round trip delay variations between the TXPCLK 72 and TXPICLK 70 clock lines.

The PFC 64 has an input terminal 76 that is coupled to the clock signal line 70 to receive the TXPICLK signal. Another input terminal 74 of the PFC 64 is coupled to an output terminal of a clock multiplying unit (CMU) 56. The CMU 56 has an input terminal 58 that receives a reference clock signal called "TXREFCLK." The CMU 56 synchronizes the signal that appears on the clock signal line 62 with the TXREFCLK reference clock signal, although the frequency of the clock signal on the clock signal line 62 may be significantly higher than the frequency of the TXREFCLK reference clock signal. The CMU 56 also produces a lower frequency clock signal on the input terminal 74 of the PFC 64, and this lower frequency clock signal is synchronized to the clock signal that is present on the clock signal line 62.

The clock signal line 70 is coupled to the clock signal line 72 internally in the interfacing ASIC 67 that, in turn is coupled to the output terminal of the VCO 66. Due to this arrangement, the resultant phase locked loop circuit that is formed from the PFC 64 and the VCO 66 operates to synchronize the TXPICLK signal with the clock signal that is provided by the CMU 56 at the input terminal 74. Thus, as a result of this arrangement the TXPICLK signal that appears on the clock signal line 70 and the TXPCLK signal that appears on the clock signal 72 are each in synchronization with the clock signal that appears on the clock signal line 62.

An advantage of this arrangement depicted in FIG. 2 is that the transmitter 50 may be fabricated from a single integrated circuit that exists in the transmit path. Furthermore, this arrangement provides an infinite phase margin at low frequency round trip delay variations. A disadvantage of this arrangement is that there is no inherent or built-in jitter clean-up function. Thus, the transmitter 50 may require a stable (i.e., a "clean") TXREFCLK reference clock signal. Otherwise, excessive jitter may occur.

Referring to FIG. 3, for purposes of providing a jitter clean-up function, a circuit between the reference clock source and the reference clock input terminal on the transmitter 50 (i.e., the reference clock input on the CMU 56) may be alternatively used. In this manner, the circuit 69 includes the transmitter 50. However, in the circuit 69, the transmitter 50 is connected in a different configuration (described below), and the transmitter 50 is also used in connection with an external voltage controlled crystal oscillator (VCXO) 112.

Unlike the transmitter 50 depicted in FIG. 2, the PFC 64 of the circuit 69 is used in an arrangement that synchronizes the clock signal on the clock signal line 62 with the TXREFCLK reference clock signal. In this manner, one input terminal 76 of the PFC 64 receives the TXREFCLK reference clock signal from the clock signal line 58, and the other input terminal of the PFC 64 receives the output signal from the CMU 56, in the same manner as described in connection with the transmitter 50 of FIG. 2. However, the output terminal of the PFC 64 is coupled to the voltage controlled crystal oscillator 112 (and a loop filter 100) to form a phase locked loop circuit for controlling the signal that appears on an input terminal of the CMU 56.

Due to this arrangement, the resultant phase loop locked circuit of the circuit 69 regulates the frequency and phase of the clock signal that is provided to the CMU 56 to "lock" this signal to the TXREFCLK signal. In response to the clock signal that is provided by the VCXO 112, the CMU 56 generates the clock signal on the clock signal line 62, as well as the clock signals present on the clock signal lines 74 and 78 (other output clock signal lines from the CMU 56).

An advantage of the circuit 69 is that a jitter clean-up function is provided due to the VCXO-based phase locked loop circuit. Thus, due to this arrangement a clean TXREFCLK reference clock signal is not required. A disadvantage of the circuit 69 is that less phase margin is present, as compared to the arrangement depicted in FIG. 2. Thus, the arrangements depicted in FIGS. 2 and 3 have various advantages and disadvantages that trade off between the different architectures.

Figure 4:
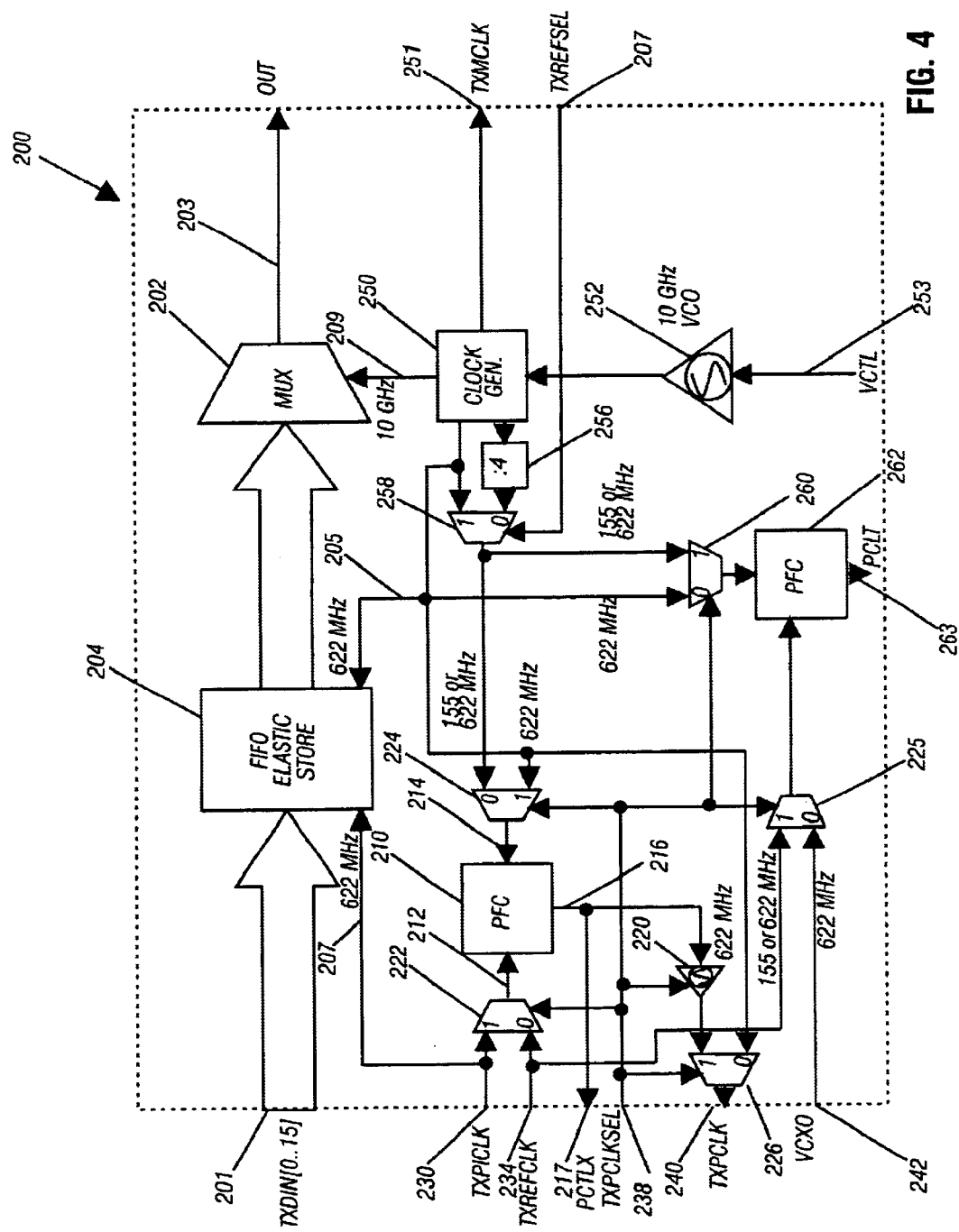
FIG. 4 is a schematic diagram of a serializer/transmitter having a selectable clocking architecture according to an embodiment of the invention.

For purposes of permitting either architecture, a transmitter 200 that has a selectable clocking architecture in accordance with the invention is depicted in FIG. 4. The transmitter 200 includes a first-in-first-out (FIFO) 204 that is coupled to a first clock signal line 204 that communicates a clock signal (called "TXPICLK") and is also coupled to a second clock signal line 205. The FIFO 204 receives data in synchronization with the TXPICLK signal, and the FIFO 204 transmits its stored data to a parallel-to-serial conversion circuit, or selector 202, in synchronization with the clock signal that appears at the clock signal line 205. The selector 202, in turn, has an output terminal 203 that may be coupled to, for example, a serial bus or for the case of an optical bus, an optical source that drives the optical bus. The selector 202 also includes a clock terminal 209 that receives a clock signal for clocking the transfer of serial data from the selector 202 to the output terminal 203. The FIFO 204 has input data lines 201 that receives input data, such as data from an output register (not depicted in FIG. 4).

The remaining circuitry depicted in FIG. 4 forms clock circuitry to generate the clock signals that appear on the clock signal lines 205, 207 and 209. In particular, this circuitry selects one of two clock generation modes for the transmitter 200. In this manner, in a first mode, the circuitry generates the clock signal present on the clock signal line 209 in synchronization with a reference clock signal (called "TXREFCLK"). Furthermore, in this first mode, the clock circuitry of the transmitter 200 synchronizes the clock signals present on the clock signal lines 205 and 207 in synchronization with the clock signal present on the clock signal line 209. In a second mode of operation, the clock circuitry of the transmitter 200 generates the clock signals present on the clock signal lines 205 and 207 in synchronization with the TXREFCLK reference clock signal and synchronizes the generation of the clock signal on the clock signal line 209 in synchronization with the clock signals on the clock signals lines 205 and 207.

To describe the first and second modes, the structure of the transmitter 200 is first discussed below in connection with FIG. 4. Next, the two different modes in the context of this structure is discussed in connection with FIGS. 5 and 6.

Referring to FIG. 4, the transmitter 200 includes a phase frequency comparator (PFC) 210 that includes an input terminal 212 and an input terminal 214. As further described below, the transmitter 200 configures one input terminal 212, 214 as an input signal terminal and the other input terminal 212, 214 as the feedback signal input terminal, depending on the particular mode of operation. The input terminal 212 is coupled to the output terminal of a 2:1 selector 222 that has a first input terminal that is coupled to a clock signal line that is coupled to the TXPICLK input clock signal line 207 and another input terminal that is coupled to a clock signal line 234 that communicates the TXREFCLK reference clock signal. The select input terminal of the selector 222 is coupled to a clock signal line 238 that communicates a signal called "TXPCLKSEL," a signal that is selectively asserted or de-asserted to place the transmitter 200 in one of the two modes. An output terminal 216 of the PFC 210 is coupled to an external terminal 217 of the transmitter 200 and is coupled to the input terminal of a voltage controlled oscillator (VCO) 220.

The other input terminal 214 of the PFC 210 is coupled to the output terminal 214 of a 2:1 selector 224. The output terminal the VCO 220 is coupled to one input terminal of the 2:1 selector 226. The select terminal of the selector 226 is coupled to the TXPCLKSEL select signal 238, the output terminal of the selector 226 is coupled to a clock signal line 240 that communicates the TXPCLK signal, and the input terminal of the selector 226 is coupled to one of the output terminals of the clock generator 250. The other input terminal of the selector 224 is coupled to the output terminal of a selector 258. The select input terminal of the selector 258 receives a selection signal called "TXREFSEL" that is communicated over a signal line 207 for purposes of selecting the frequency of the clock signal that appears on the output terminal of the selector 258. One input terminal of the selector 258 is coupled to input terminals of the selectors 224 and 226. The other input terminal of the selector 258 is coupled to the output terminal of a frequency divider 256.

The input terminal of the frequency divider 256 is coupled to another output terminal of the clock generator 250.

Another output terminal of the clock generator 250 provides the clock signal to the clock signal line 209. Another output terminal of the clock generator 250 provides an output signal on an output clock signal line 251, and an input terminal of the clock generator 250 is coupled to the output terminal of a VCO 252. The input terminal of the VCO 252 is coupled to an external terminal 253 that is used as described below.

The transmitter 200 also includes a selector 225 that has one input terminal that is coupled to the clock signal line 234. Another input terminal of the selector 225 is coupled to an external terminal 242 that is used as described below. An output terminal of the selector 225 is coupled to the input terminal of a PFC 262. The output terminal of the PFC 262 is coupled to an external output terminal 263 that is used as described below. Another input terminal of the PFC 262 is coupled to the output terminal of a selector 260. One input terminal of the selector 260 is coupled to the clock signal line 205, and another input terminal of the selector 260 is coupled to the output terminal of the selector 258. As depicted in FIG. 4, the PFC 262, selector 260, selector 258, frequency divider 256, clock generator 250 and VCO 252 form a clock multiplying unit (CMU) 208.

Figure 5:
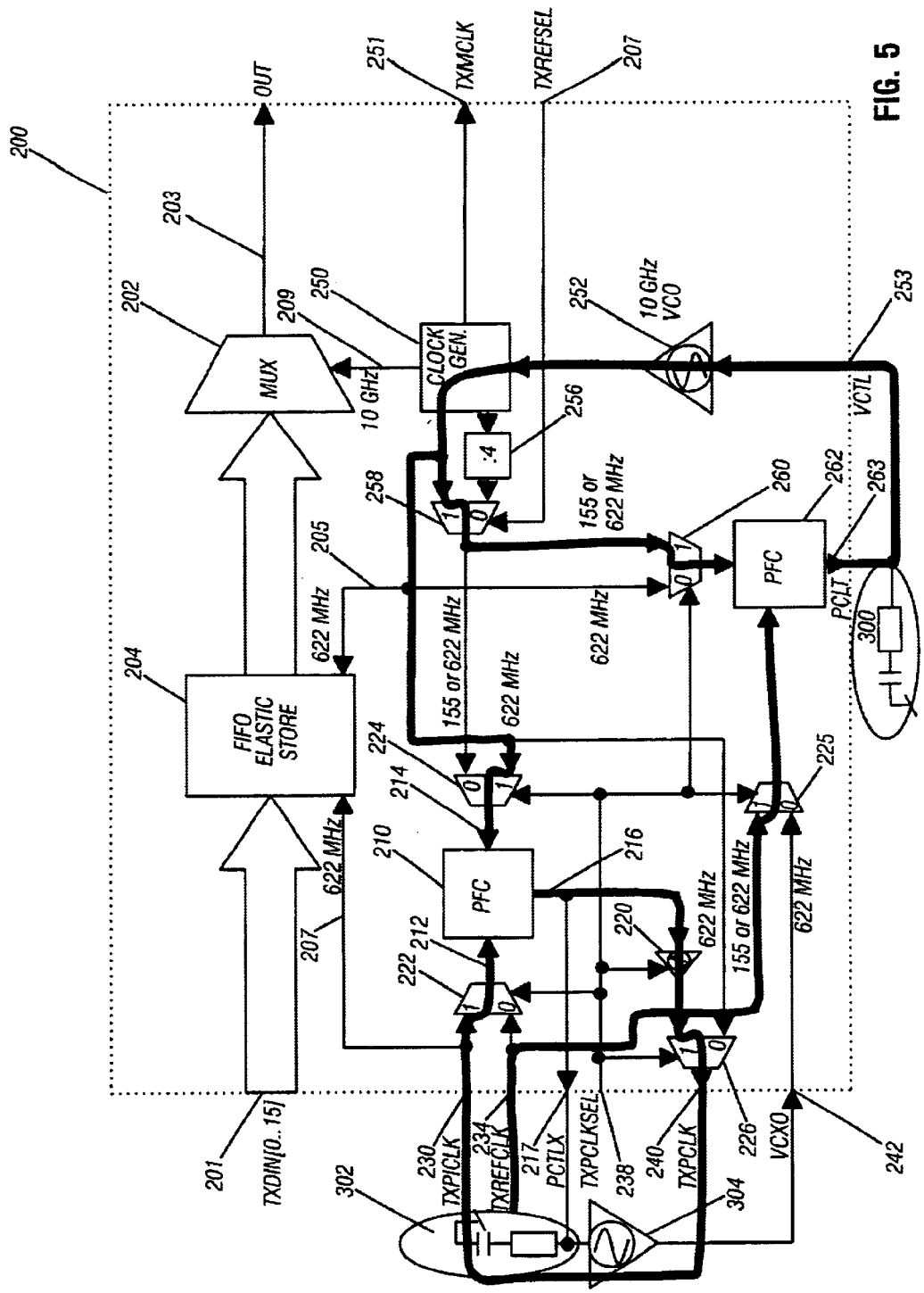
FIGS. 5 and 6 illustrate the transmitter of FIG. 4 in different modes of operations according to an embodiment of the invention.

Due to the above-described arrangement, the TXPCLKSEL signal may be asserted (driven high, for example) to place the transmitter 200 in the first mode and establish the signal paths that are depicted in FIG. 5. For this mode, the transmitter 200 is coupled to additional circuitry that is external to the transmitter 200. For example, the circuitry may include, for example, a loop filter 302 that is coupled between the clock signal terminal 217 at ground. A voltage controlled crystal oscillator (VCXO) 304 has its input terminal coupled to the clock signal 217. The output terminal of the VCXO 304 is coupled to the clock signal terminal 242. This circuitry also includes a loop filter 300 that is coupled between the terminal 263 and ground.

In response to the TXPCLKSEL signal being asserted, the TXREFCLK reference clock signal is routed through the selector 225 to an input terminal of the PFC 262. Furthermore, the PFC 262 compares the phase and frequency of this input signal to the phase and frequency of an output signal of the clock generator 250. Thus, the PFC 262 controls VCO 252 in a closed loop to synchronize the clock signals generated by the clock generator 250 to the TXREFCLK reference clock signal. An output signal from the clock generator 250 appears on the clock signal line 205 and appears at the input terminal 214 of the PFC 210.

Furthermore, the output signal present at the output terminal 216 of the PFC 210 is routed back to the input terminal 212 of the PFC 210. Due to this arrangement, the PFC 210 compares the phase and frequency of the clock signal present on the clock signal line 207 with the clock signal generated by the clock's generator 250 that appears on the input terminal 214. Therefore, due to this arrangement, a phase locked loop formed from the PFC 210 and the VCO 220 synchronizes the phase of the signal that appears on the clock signal line 207 with the clock signal that appears on the clock signal line 209. As depicted in FIG. 5, the clock signal that appears on the clock signal line 205 is also generated by the clock generator 250.

Therefore, in the arrangement that is depicted in FIG. 5, the reference clock signal is used to generate the clock signal that synchronizes operation of the selector 202. The clock signal that synchronizes the storing of data in the FIFO 204 is generated in synchronization with the clock signal that appears on the clock signal line 209.

Figure 6:
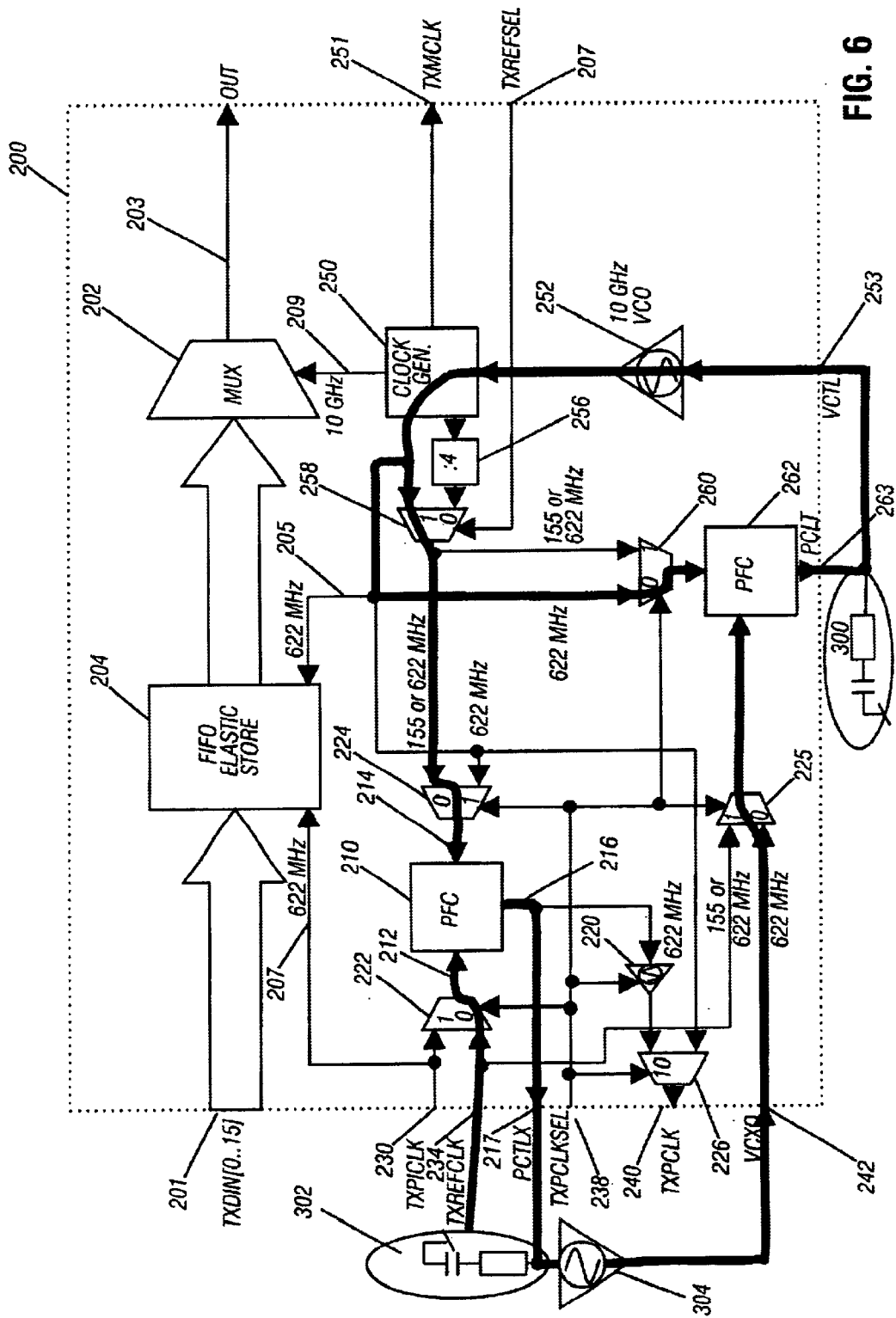

The TXPCLKSEL signal may be de-asserted (driven low, for example) to place the transmitter 200 in a second mode of operation to establish the signal paths that are depicted in FIG. 6. In this second mode of operation, the input terminal 212 of the PFC 210 becomes a reference or input signal to the PFC 210, and the PFC 210 synchronizes this signal to the signal that appears on the input terminal 214. In this case, during the second mode, the signal that appears on the input terminal 216 is the output signal from the clock generator 210. Thus, as depicted in FIG. 6, in the transmitter's second mode of operation, the PFC 210, VCXO 304 and loop filter 302 form a phase locked loop circuit for generating both clock signals on the clock signal lines 205 and 207 in synchronization with the TXREFCLK reference clock signal. The clock generator 210 generates the clock signal present on the clock signal line 209 in synchronization with the signals.

Figure 7:
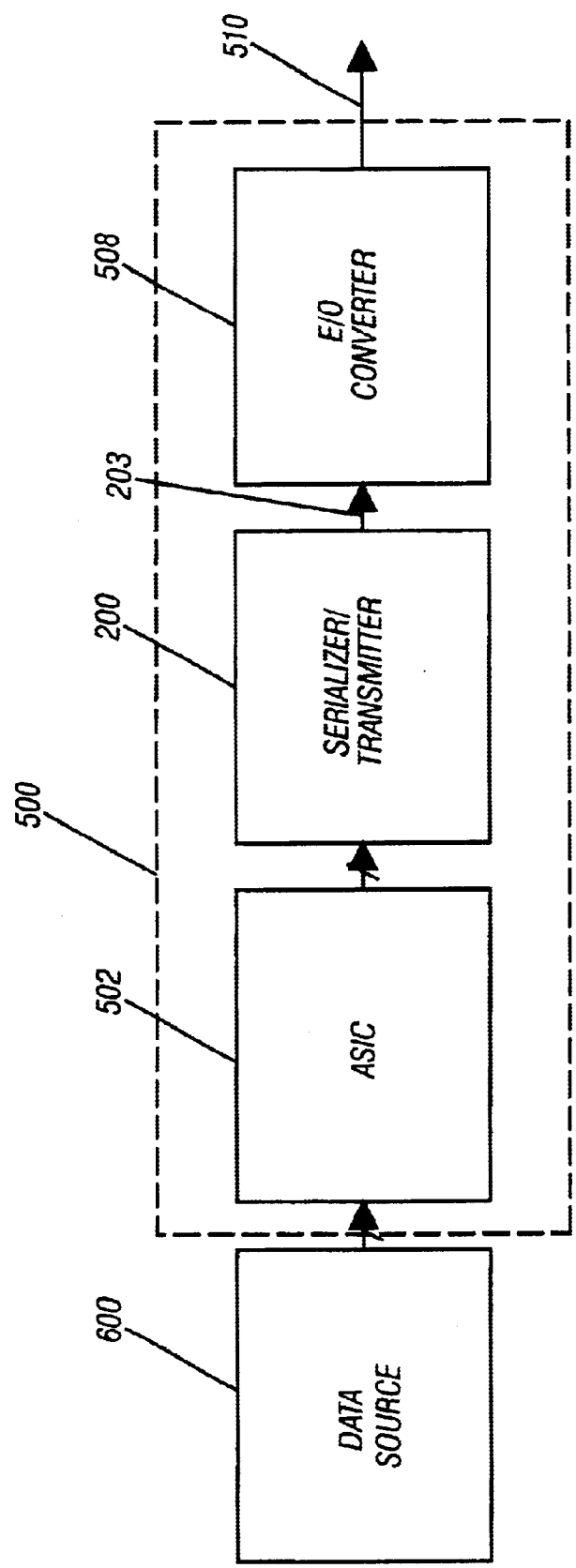
FIG. 7 is a schematic diagram of an optical line transmitter according to an embodiment of the invention.

Referring to FIG. 7, in some embodiments of the invention, the transmitter 200 may be part of an optical line transmitter card 500 that is part of an optical transport network (OTN), for example. As examples, the transmitter card 500 may be part of an optical network router or switch. The transmitter card 500 may include an application specific integrated circuit (ASIC) 502 (an optical network framer or forward error correction device, as just a few examples) that includes an output register (not shown in FIG. 7) that furnishes data in parallel to FIFO 204 (FIG. 4) of the transmitter 200. Data is received by the ASIC 502 from a data source 600, such as a computer, or network bridge, as just a few examples. The optical transmitter card 500 may also include an optical source 508 (a laser diode device, for example) that produces an optical signal on an optical serial bus 510 in response to the signal present on the output terminal 203 of the transmitter 200. Other variations are possible.

Referring back to FIG. 4, the mode selection (via the TXPCLKSEL signal) of the transmitter 200 may be set in numerous ways. For example, the input signal line 238 may be hardwired to a particular voltage level (i.e., a logic one or logic zero level) to select the mode for the transmitter 200. Alternatively, the signal level of the TXPCLKSEL signal may be set via a bit in a programmable register. Other arrangements are possible.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:
   providing a first clock signal to a parallel-to-serial data conversion circuit;
   providing a second clock signal to a memory storing data for conversion by the conversion circuit;
   selectively synchronizing one of the first and second clock signals to a reference clock signal.

2. The method of claim 1, further comprising:
   synchronizing the other one of said one of the first and second clock signals to said one of the first and second clock signals.

3. The method of claim 1, wherein selectively synchronizing comprises:

selectively placing the synchronization circuit in a first mode to synchronize the first clock signal to the reference clock signal and a second mode to synchronize the second clock signal to the reference clock signal.

4. The method of claim 1, wherein selectively synchronizing comprises:
selectively providing one of the reference clock signal and an indication of the first clock signal to an input terminal of a phase locked loop circuit.

5. The method of claim 4, wherein in response to providing the reference clock signal to the input terminal of the phase locked loop circuit, synchronizing the first clock signal to the reference clock signal.

6. The method of claim 5, further comprising:
in response to providing the reference clock signal to the input terminal of the phase locked loop circuit, synchronize the second clock signal to the first clock signal.

7. The method of claim 4, wherein in response to providing the indication of the first clock signal to the input terminal of the phase locked loop circuit, synchronizing the first clock signal to the second clock signal.

8. The method of claim 4, wherein in response to providing the indication of the first clock signal to the input terminal of the phase locked loop circuit, synchronizing the second clock signal to the first clock signal.

9. An apparatus comprising:
a parallel-to-serial data conversion circuit to receive a first clock signal;
a memory storing data for conversion by the conversion circuit and receiving a second clock signal; and
a clock circuit to selectively synchronizing one of the first and second clock signals to a reference clock signal.

10. The apparatus of claim 9, wherein the clock circuit comprises:
a phase locked loop circuit to synchronize the other one of said one of the first and second clock signals to said one of the first and second clock signals.

11. The apparatus of claim 9, wherein the clock circuit has a first mode to synchronize the first clock signal to the reference clock signal and a second mode to synchronize the second clock signal to the reference clock signal.

12. The apparatus of claim 9, wherein the clock circuit comprises:
a phase locked loop circuit to provide one of the first and second signals, and
selector circuitry to selectively provide one of a reference clock signal and an indication of the first clock signal to an input terminal of the phase locked loop circuit.

13. The apparatus of claim 12, wherein the phase locked loop circuit provides the first clock signal and synchronizes the first clock signal to the reference clock signal in response to selector circuitry providing the reference clock signal to the input terminal of the phase locked loop circuit.

14. The apparatus of claim 12, wherein the phase locked loop circuit provides the second clock signal and synchronizes the second clock signal to the first clock signal in response to the selector circuitry providing an indication of the first clock signal to the input terminal of the phase locked loop circuit.

15. The apparatus of claim 9, wherein the parallel-to-serial conversion circuit provides a signal indicative of the data in synchronization with the first clock signal.

16. A system comprising:
a data source to provide data;
a bus;
a parallel-to-serial data conversion circuit to receive a first clock signal and generate a signal indicative of the data in a serial format in synchronization with the first clock signal;
a memory coupled to the data source to receive the data in a parallel format and communicate the data for conversion by the conversion circuit in synchronization with a second clock signal; and
a clock circuit to selectively synchronizing one of the first and second clock signals to a reference clock signal.

17. The system of claim 16, wherein the clock circuit comprises:
a phase locked loop circuit to synchronize the other one of said one of the first and second clock signals to said one of the first and second clock signals.

18. The system of claim 16, wherein the clock circuit has a first mode to synchronize the first clock signal to the reference clock signal and a second mode to synchronize the second clock signal to the reference clock signal.

19. The apparatus of claim 16, wherein the clock circuit comprises:
a phase locked loop circuit to provide one of the first and second signals, and
selector circuitry to selectively provide one of a reference clock signal and an indication of the first clock signal to an input terminal of the phase locked loop circuit.

20. The system of claim 19, wherein the phase locked loop circuit provides the first clock signal and synchronizes the first clock signal to the reference clock signal in response to selector circuitry providing the reference clock signal to the input terminal of the phase locked loop circuit.

21. The system of claim 19, wherein the phase locked loop circuit provides the second clock signal and synchronizes the second clock signal to the first clock signal in response to the selector circuitry providing an indication of the first clock signal to the input terminal of the phase locked loop circuit.

* * * * *